United States Patent
Ehlert et al.

(10) Patent No.: US 6,910,144 B2
(45) Date of Patent: Jun. 21, 2005

(54) METHOD AND CONFIGURATION FOR GENERATING A CLOCK PULSE IN A DATA PROCESSING SYSTEM HAVING A NUMBER OF DATA CHANNELS

(75) Inventors: Martin Ehlert, Berlin (DE); Karl Schroedinger, Berlin (DE)

(73) Assignee: Infineon Technologies AG, Munich (DE)

( * ) Notice: Subject to any disclaimer, the term of this patent is extended or adjusted under 35 U.S.C. 154(b) by 492 days.

(21) Appl. No.: 09/998,720

(22) Filed: Nov. 30, 2001

(65) Prior Publication Data

US 2002/0073350 A1 Jun. 13, 2002

(30) Foreign Application Priority Data

Nov. 30, 2000 (DE) .......................................... 100 61 167

(51) Int. Cl.[7] .................................................. H03K 5/13
(52) U.S. Cl. .................................... 713/400; 713/401
(58) Field of Search ................................. 713/400, 401

(56) References Cited

U.S. PATENT DOCUMENTS

| | | | |
|---|---|---|---|
| 5,317,288 A | 5/1994 | Yung et al. | |
| 5,614,855 A | 3/1997 | Lee et al. | |
| 5,825,732 A | * 10/1998 | Arataki | 369/47.45 |
| 6,703,865 B2 | * 3/2004 | Chan | 326/82 |
| 6,833,734 B2 | * 12/2004 | Chan | 326/82 |

FOREIGN PATENT DOCUMENTS

| | | |
|---|---|---|
| DE | 19834416 A1 | 2/1999 |
| DE | 19830571 A1 | 1/2000 |
| EP | 0349715 A2 | 1/1990 |

OTHER PUBLICATIONS

Lee, Thomas H. et al.: "A 2.5 V CMOS Delay–Locked Loop for an 18 Mbit, 500 Megabyte/s DRAM", IEEE, vol. 29, No. 12, Dec. 1994, pp. 1491–1496.

Kim, C. et al.: "A 640 MB/s Bi–Directional Data Strobed, Double–Data–Rate SDRAM with a 40 mW DLL Circuit for a 256 MB Memory System", IEEE, Feb. 6, 1998.

* cited by examiner

*Primary Examiner*—A. Elamin
(74) *Attorney, Agent, or Firm*—Laurence A. Greenberg; Werner H. Stemer; Ralph E. Locher

(57) ABSTRACT

A method and a configuration for generating a clock pulse in a data processing system having a number of independent, non-synchronous digital data channels, is described. A phase-locked loop (PLL) circuit derives a reference clock pulse, particularly from the data or a co-supplied clock pulse of a data channel serving as a reference channel, the acquired reference clock pulse is supplied to the data channels and a delay-locked loop (DLL) circuit compensates for differences in a clock pulse frequency between the reference clock pulse and the further data channels. As a result, only one reference clock pulse is sufficient in a data processing system having a number of independent, non-synchronous digital data channels, so that the jitter generated in the system is reduced.

17 Claims, 3 Drawing Sheets

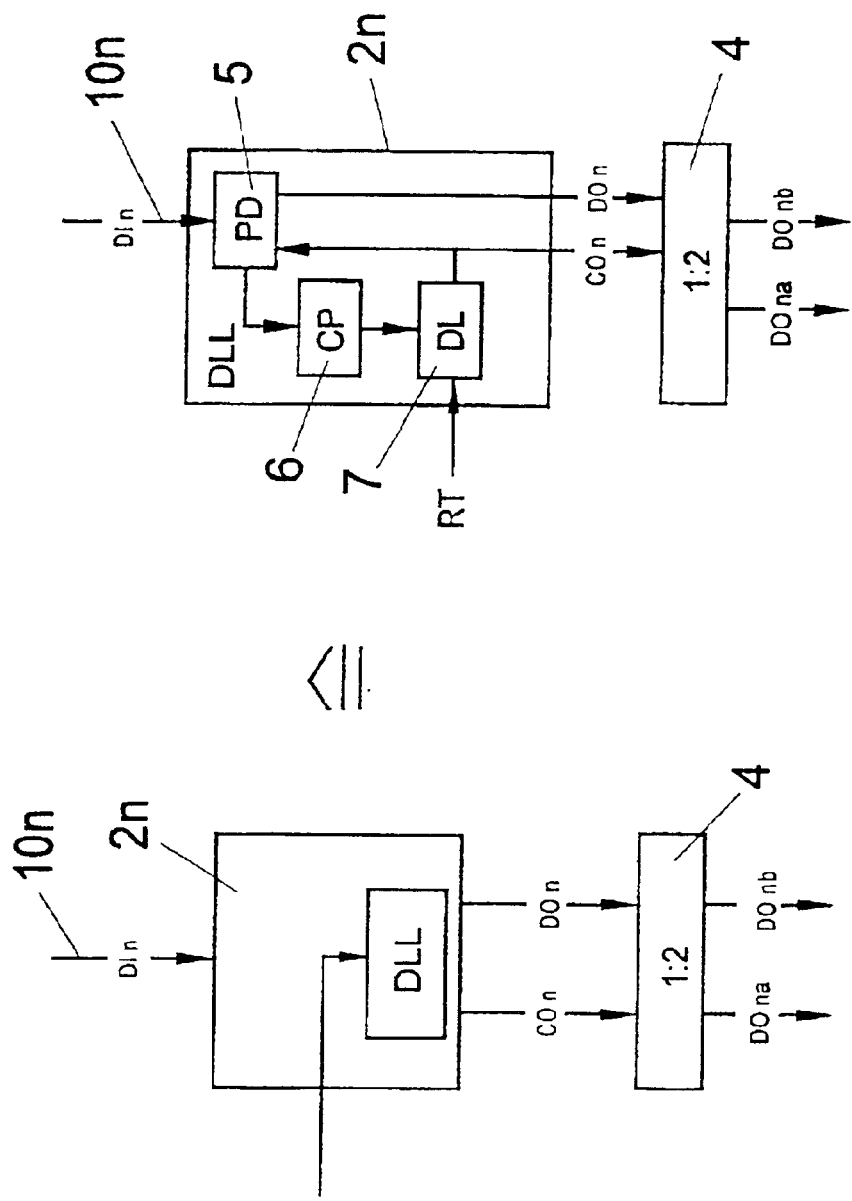

METHOD AND CONFIGURATION FOR GENERATING A CLOCK PULSE IN A DATA PROCESSING SYSTEM HAVING A NUMBER OF DATA CHANNELS

BACKGROUND OF THE INVENTION

Field of the Invention

The present invention relates to a method and a configuration for generating a clock pulse in a data processing system having a number of data channels.

Data processing systems with a number of independent data channels, particularly integrated switching networks (ICs) are problematic since the individual channels can have different data rates as a result of different clock pulse frequencies given the transmission of data on the different data channels. In the corresponding standards, two hundred ppm usually is the maximum allowed deviation of the different data rates or, respectively, clock pulse frequencies. Due to the described problem, it is not possible to simultaneously process a number of independent channels, in a data processing system, with only one clock pulse without additional measures.

In order to solve the explained problem, a configuration is known wherein, for each data channel, a required system clock pulse is acquired on a basis of a phase-locked loop (PLL) circuit from the data of the respective data channel or from a co-supplied clock pulse. A PLL circuit has a voltage-controlled oscillator (VCO) providing the desired clock pulse. PLL circuits are known in the prior art and, therefore, are not described in greater detail.

The configuration has the disadvantage that a PLL circuit is necessary for each data channel to be sampled in order to realize a signal sampling of a number of independent channels having different data rates. Therefore, a number of voltage-controlled oscillators (VCO) must be disadvantageously used. In addition to the costs associated therewith, there is the danger that the voltage-controlled oscillators or, respectively, PLL circuits disturb each other as a result of coupling processes and thus generate an undesired jitter in the system.

As an alternative to the use of a PLL circuit, the use of a delay-locked loop (DLL) is known from the prior art, which generates an output signal having a predetermined delay vis-à-vis an input reference signal. For example, U.S. Pat. No. 5,614,855, Published, European Patent Application No. EP 0 349 715 A2 and U.S. Pat. No. 5,317,288 describe DLL circuits. The article by T. H. Lee, K. S. Donnelly, J. T. C. Ho, J. Zerbe, M. G. Johnson, C. Eshikawa: titled "A 2.5 V CMOS Delay-Locked Loop for 18 Mbit, 500 Megabyte/s DRAM", IEEE-Journal of Solid-State Sircoits, vol. 29, No. 12, December 1994, pages 1491 to 1496 describes a DLL circuit having an infinite delay range or, respectively, dynamic range. Therefore, the DLL circuit can arbitrarily delay an output signal in its phase. As a result, the phase difference between two channels can be continuously adapted.

SUMMARY OF THE INVENTION

It is accordingly an object of the invention to provide a method and a configuration for generating a clock pulse in a data processing system having a number of data channels that overcome the above-mentioned disadvantages of the prior art methods and devices of this general type, which avoids the necessity of using a number of PLL circuits and which reduce the jitter in the system as much as possible.

With the foregoing and other objects in view there is provided, in accordance with the invention, a method for generating a clock pulse in a data processing system having a plurality of independent, non-synchronous digital data channels. The method includes the steps of deriving a reference clock pulse; supplying the reference clock pulse to the data channels; and compensating for differences in a clock pulse frequency between the reference clock pulse and each of the data channels using a delay-locked loop circuit.

The reference clock pulse is to be inventively derived and the reference clock pulse is to be supplied to all the data channels. On the basis of the delay-locked loop (DLL) circuit, the difference with respect to the clock pulse frequency between the reference clock pulse and the respective data channel is compensated for each data channel. The DLL circuit has an infinite delay range and a bandwidth that is greater than the difference between the frequency of the reference clock pulse and the frequency of the respective data channel.

In the inventive solution, only one reference clock pulse, therefore, is required and the reference clock pulse is adjusted by the DLL circuit for all further channels such that both channels have the same frequency and the same phase length, so that the data can be correctly sampled. The advantage associated therewith is that a PLL circuit is not necessary for each data channel.

Since only one source of clocking is used, disturbances or, respectively, couplings between the individual data channels do not occur, so that the jitter generated in the system is reduced.

The invention can be realized independently of the type of data transmission on the data channels. In particular, the data can be transmitted as electrical signals or optical signals, whereby suitable optoelectronic transducers are to be potentially used at optoelectronic interfaces.

The reference clock pulse derived from the data or a co-supplied clock pulse of a data channel serving as a reference channel is preferably acquired by a phase-locked loop (PLL) circuit. An arbitrary data channel can be used as a reference channel. The PLL circuit, with its voltage-controlled oscillator (VCO), provides a source of clocking for all data channels, so that the number of required PLL circuits is reduced to one.

However, it is also within the framework of the invention that the reference clock pulse is acquired by an independent clock generator such as a quartz oscillator.

In an advantageous embodiment of the inventive method, the DLL circuit continuously adapts the phase of the reference clock pulse to the phase of the data channel for each data channel, i.e., the delay between the reference clock pulse and the data channel is continuously adapted. Therefore, the differences between the clock pulse frequency or, respectively, the data rate of the reference clock pulse and of the respective data channel are compensated as a result of the continuous adaptation of the phase of the reference clock pulse. It is thus possible to use only one reference clock pulse for all data channels, although these are not synchronized.

In an advantageous embodiment of the inventive method, the data of the data channel are sampled by the adapted reference clock pulse for each data channel. The sampling frequency is thereby identical with the data frequency of the respective data channel. As a result of the use of the DLL circuit, it is assured that the reference clock pulse and the data channel have the same phase length and the same frequency, so that a reliable sampling is possible.

However, it is to be pointed out that different applications of a signal compensation between the reference clock pulse and the data channels are also in the framework of the invention. For example, it can be provided that the reference clock pulse signals and data channel signals, which are adapted to one another with respect to their clock pulse frequency and phase position, can be used for controlling further functional groups.

With the foregoing and other objects in view there is provided, in accordance with the invention, a configuration for generating a clock pulse in a data processing system having a plurality of independent, non-synchronous digital data channels. The configuration contains a device for generating a reference clock pulse, and a plurality of signal sensor blocks each allocated to one of the data channels and each connected to the device for receiving the reference clock pulse. Each of the signal sensor blocks has a delay-locked loop circuit for compensating for differences in a clock frequency between the reference clock pulse and a respective data channel. The delay-locked loop circuit has an infinite delay range and a bandwidth larger than the difference between the clock frequency of the reference clock pulse and the clock frequency of the respective data channel.

In addition to the device for generating the reference clock pulse, the inventive configuration has a number of the signal sensor blocks that are each allocated to a data channel and whereby the generated reference clock pulse is allocated to them. Each of the signal sensor blocks realizes a DLL circuit for compensating differences in the clock pulse frequency between the reference clock pulse and the respective data channel.

The device for generating the reference clock pulse preferably contains a phase-locked loop circuit for deriving a reference clock pulse from the data or a co-supplied clock pulse of a data channel serving as a reference channel.

In the inventive configuration, the individual data channels and the respectively allocated sensor blocks are preferably identically constructed. It is thus assured that the individual data channels exhibit identical transmission behavior.

The individual data channels are preferably connected to a receiver module, particularly to a demultiplexer, or to a transmitter module, particularly to a mutliplexer. On principle, a corresponding multiplexer or demultiplexer can be realized for any arbitrary number of channels.

In accordance with a concomitant feature of the invention, the delay-locked loop circuit has a phase detector, a charge pump connected to the phase detector, and a phase modifier connected to the charge pump.

Other features which are considered as characteristic for the invention are set forth in the appended claims.

Although the invention is illustrated and described herein as embodied in a method and a configuration for generating a clock pulse in a data processing system having a number of data channels, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a block circuit diagram of functional assemblies of a signal sensor block according to FIG. 3; and FIG. 5 is a block circuit diagram of a delay-locked loop.

DESCRIPTION OF THE PREFERRED EMBODIMENTS

Figure 2:
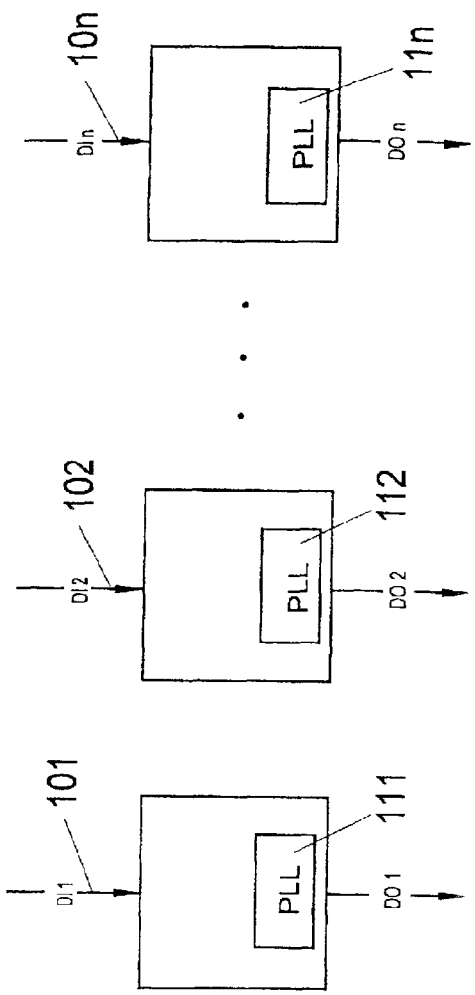
FIG. 2 is a block circuit diagram of a configuration according to the prior art.

Referring now to the figures of the drawing in detail and first, particularly, to FIG. 2 thereof, there is shown a known configuration. For each data channel 101, 102, 10n, a required system clock pulse is acquired on a basis of a phase-locked loop (PLL) circuit 111, 112, 11n from the data of the respective data channel or from a co-supplied clock pulse. A PLL circuit has a voltage-controlled oscillator (VCO) providing the desired clock pulse. PLL circuits are known in the prior art and, therefore, are not described in greater detail.

Figure 1:
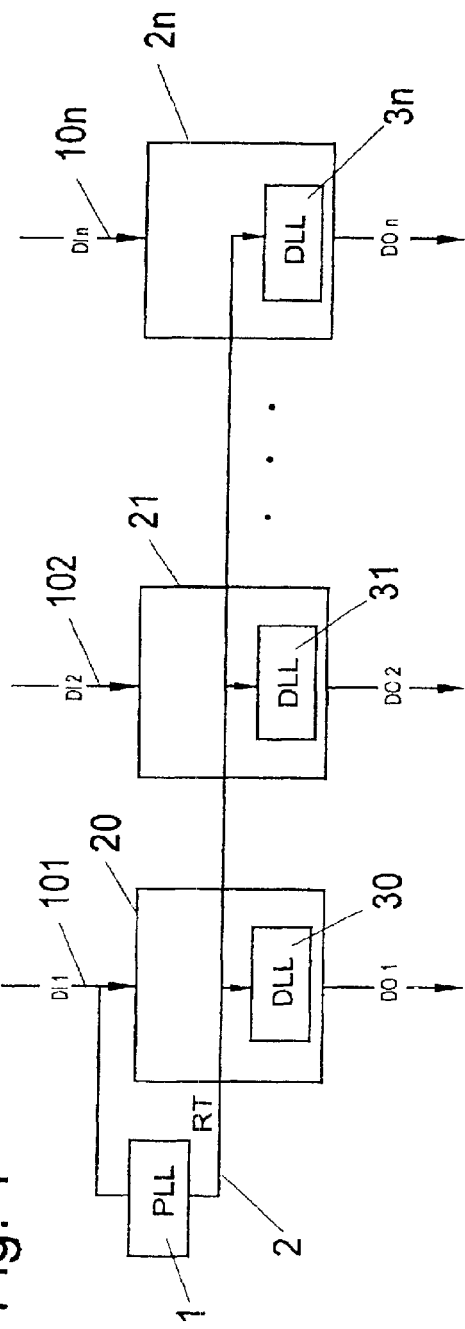
FIG. 1 is a block circuit diagram of a configuration for generating a clock pulse with a number of non-synchronous data channels according to the invention.

The inventive configuration shown in FIG. 1 has a number of the data channels 101, 102, . . . 10n. On which each have a signal sensor block 20, 21, . . . 2n allocated. The signal sensor blocks 20, 21, . . . 2n samples data DI1, DI2, . . . DIN (DI=Data In) incoming on the respective data channels and outputs the sampled data as output data DO1, DO2, . . . DOn (DO=Data Out). The individual data channels 101, 102, . . . 10n are independent and are not synchronized, so that the data rates on the different data channels 101, 102, . . . 10n can deviate from one another.

In order to realize a signal sampling, it is necessary to allocate a reference clock pulse to each of the signal sensor blocks 20, 21, . . . 2n. For this purpose, an arbitrary data channel is selected as a reference channel (the data channel 101 in FIG. 1) and the PLL circuit, in a way that is known per se, derives a reference clock pulse RT from the data of the reference channel 101 or, respectively, from a co-supplied clock pulse. The reference clock pulse is thereby made available to the PLL circuit by a non-illustrated voltage-controlled oscillator (VCO).

The reference clock pulse RT generated by the PLL circuit is supplied to the individual signal sensor blocks 20, 21, . . . 2n over a trunk line 2. The individual signal sensor blocks 20, 21, . . . 2n each have a delay-locked loop (DLL) circuit 30, 31, 3n. The DLL circuit determines a phase difference between the reference clock pulse and the data signal of a respective data channel 101, 102, . . . 10n and adjusts the reference clock pulse with respect to the data signal such that the data DI1, DI2, . . . DIn are correctly sampled.

The DLL circuit compensates for differences in a clock pulse frequency between the reference clock pulse and the respective data channel by continuously adapting a delay between the reference clock pulse and the data signal.

It is to be pointed out that a separate DLL circuit can also be foregone with respect to the reference channel, and the clock pulse that is generated by the PLL circuit 1 can be directly used. In this case, the PLL circuit 1 must generate the correct runtime performance for the reference channel 101. If the reference channel 101 also contains a DLL circuit (as in FIG. 1), the only task of the PLL circuit is to generate an independent reference clock pulse for all signal sensor blocks 20, 21, . . . 2n. On the basis of the DLL circuits 30, 31, . . . 3n, an identical phase and an identical frequency of the reference clock pulse and the respective data channel is subsequently adjusted for each data channel.

Figure 3:
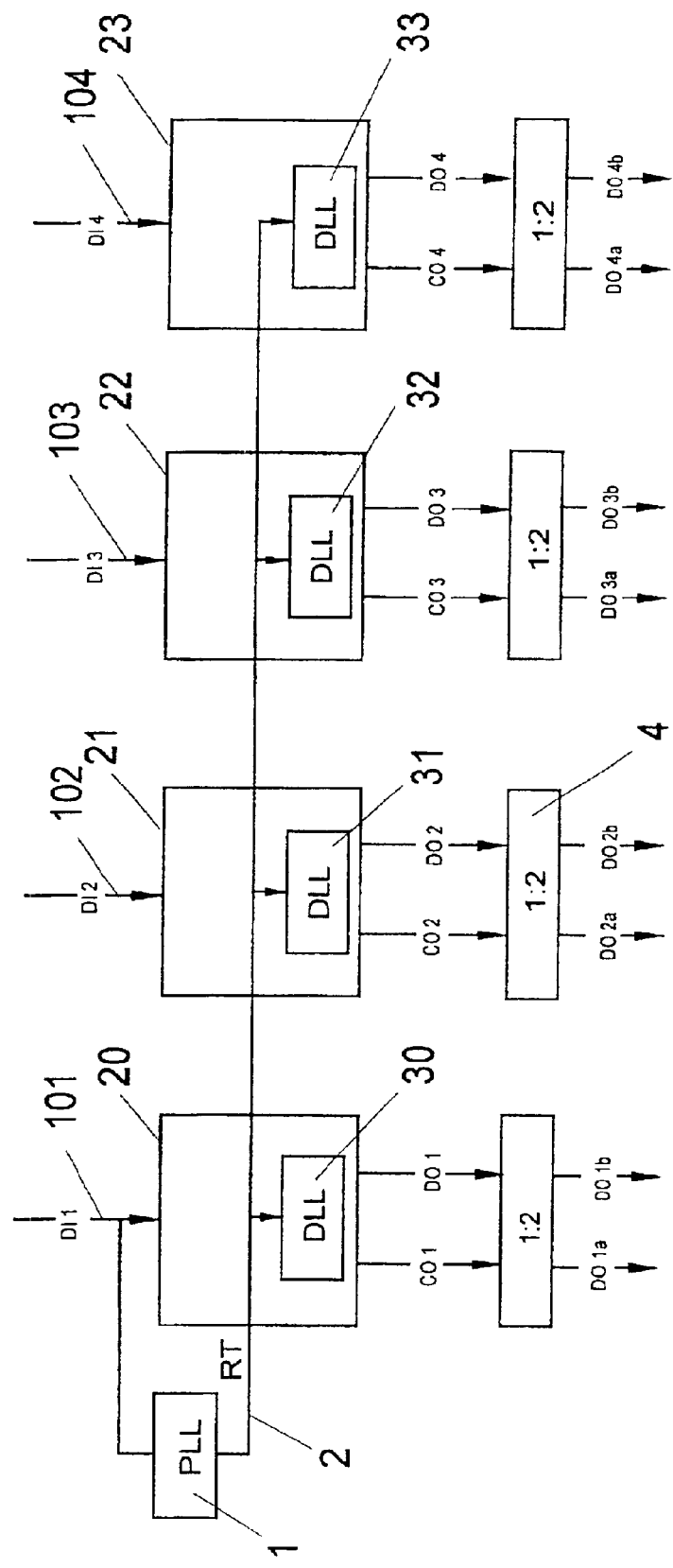
FIG. 3 is a block circuit diagram of an exemplary embodiment for a 4-channel demultiplexer module according to the invention.

This is subsequently further explained on the basis of the exemplary embodiment of the FIGS. 3 and 4. FIG. 3 represents a configuration for generating a clock pulse for a 1:2 demultiplexer module 4 for four data channels. The number of four data channels is to be understood only as an example, and the configuration can also be realized for any arbitrary number of channels.

The individual data channels 101, 102, 103, 104 and the signal sensor blocks 20, 21, 22, 23 are configured as shown in FIG. 1. The data channel 101 is exemplarily used again as the reference channel. The PLL circuit 1 provides the reference clock pulse RT for the signal sampling for all the signal sensor blocks 20, 21, 22, 23.

The signal sensor blocks 20 to 23 each have two signal outputs, one output for the sampled, outgoing data DO1 to DO4 and one output for a clock pulse signal CO1 to CO4 (CO=Clock Out). The clock pulse signal CO1 to CO4 has a different clock pulse than the reference clock pulse RT which is provided by the PLL circuit 1. The clock pulse signal CO1 to CO4, vis-à-vis the reference clock pulse RT, is a clock pulse that is added or, respectively, subtracted with an additional frequency, as will be explained later.

The output signals of the individual signal sensor blocks 20 to 23 are supplied to the 1:2 demultiplexer 4 which respectively divides the data DO1 to DO4 into two data streams DO1a, DO1b, . . . DO4a, DO4b.

FIG. 4 schematically shows the functional components of the signal sensor block 2n. The DLL circuit has a phase detector (PD) 5, a charge pump (CP) 6 and a delay line or, respectively, a phase modifier 7, as shown in FIG. 5.

The phase detector 5, as inputs, has the data signal DIn of the relevant data channel 10n and a phase-modified reference clock pulse COn which is fed-back by the phase modifier 7. The reference clock pulse is the signal which, by using the DLL circuit, is to be oriented toward the data of the data channel 10n. Dependent on the phase difference, the phase detector 5 generates a signal and forwards it to the charge pump 6. The charge pump 6 essentially integrates the output signal of the phase detector 5 over time. The charge pump 6 controls the phase modifier 7 which, corresponding to the "charge" of the charge pump 6, adapts the phase of the reference clock pulse RT incoming at the phase modifier 7. A state is adjusted via the feedback loop in that the reference clock pulse, which is phase-delayed by the phase modifier 7, corresponds to the clock pulse frequency of the data channel 10n.

Therefore, the differences concerning the clock pulse frequency of the reference clock pulse and the data channel are compensated in that the phase of the reference clock pulse is continuously adaptated. This is possible since the frequency is the derivative of the phase over time. As a result of the continuous modification of the phase over time by the DLL circuit, an additional frequency $\Delta\phi/\Delta t$ is added to the reference clock pulse, so that the difference between the frequency of the reference clock pulse and the data rate of the respective channel is compensated.

It is important that the delay line or, respectively, the phase modifier DL 7 of the DLL circuit has an infinite dynamic range, i.e., the DLL circuit can generate delays of $\phi = x + n \cdot 2\pi$ with x from [0; 2n] and n from N. It is also necessary that the bandwidth of the DLL circuit is greater than the difference of the clock pulse frequency of the reference clock pulse and the clock pulse frequency of the data channel, i.e. $\Delta\omega > \Delta\phi/\Delta t$. For example, when the reference clock pulse has a frequency of 100 MHz and the data channel has a frequency of 101 MHz, the bandwidth $\Delta\omega$ of the DLL circuit must be at least 1 MHz.

Corresponding DLL circuits, although within a different context, are described in greater detail in the aforementioned printed publications, particularly in U.S. Pat. No. 5,614,855, Published, European Patent 0 349 715 A2 and in the article by T. H. Lee, K. S. Donnelly, J. T. C. Ho, J. Zerbe, M. G. Johnson and C. Eshikawa, which are expressly incorporated herein.

As described in the article by T. H. Lee, K. S. Donnelly, J. T. C. Ho, J. Zerbe, M. G. Johnson and C. Eshikawa, two mixers and one control essentially mix four clock pulses with the phases 0°, 90°, 180° and 270° such that all the phases can be covered. It is always switched from one quadrant to the next, so that an infinite phase angle rotation can be achieved.

On the basis of the dimensioning of the charge pump 6 representing a loop filter, the bandwidth of the DLL circuit can be almost arbitrarily adjusted. The charge pump 6 includes a connected source of current and of an integration capacitor. The function of an integrator is thus obtained which, together with the remaining loop gain, forms the bandwidth of the control loop.

The reference clock pulse COn, which is adapted with respect to its phase and therefore with respect to its frequency, and the output data DOn sampled with the clock pulse COn are present at the output of the signal sensor block 2n.

It is to be pointed out that the example of a demultiplexer module 4 is to be understood only as an example. The inventive principle can also be used for transmitting modules such as multiplexers.

In alternative exemplary embodiments, the reference clock pulse RT is not generated by the PLL circuit from the data or a co-supplied clock pulse of the data channel but is provided by an independent clock generator, particularly a high-precision quartz oscillator connected to the trunk line 2. Otherwise, the described method and the described configuration are the same.

The invention is not limited to the previously described exemplary embodiments regarding its application. It is only crucial for the invention that a PLL circuit derives a reference clock pulse from a data channel, that the reference clock pulse is supplied to the further data channels and that a DLL circuit compensates for differences concerning the clock pulse frequency between the reference clock pulse and the further data channels.

We claim:

1. A method for generating a clock pulse in a data processing system having a plurality of independent, non-synchronous digital data channels, which comprises the steps of:
    deriving a reference clock pulse;
    supplying the reference clock pulse to the data channels; and
    compensating for differences in a clock pulse frequency between the reference clock pulse and each of the data channels using a delay-locked loop circuit.

2. The method according to claim 1, which comprises deriving the reference clock pulse using a phase-locked loop circuit and data provided by one of the data channels serving as a reference channel.

3. The method according to claim 1, which comprises deriving the reference clock pulse from an independent clock generator.

4. The method according to claim 1, which comprises continuously adapting a phase of the reference clock pulse, for each of the data channels, to a phase of the each of the data channels using the delay-locked loop circuit associated with each of the data channels resulting in an adapted reference clock pulse for each of the data channels.

5. The method according to claim 4, which comprises sampling data from each of the data channels using the adapted reference clock pulse.

6. The method according to claim 1, which comprises deriving the reference clock pulse from a quartz oscillator.

7. The method according to claim 1, which comprises deriving the reference clock pulse using a phase-locked loop circuit and a co-supplied clock pulse from one of the data channels serving as a reference channel.

8. A configuration for generating a clock pulse in a data processing system having a plurality of independent, non-synchronous digital data channels, the configuration comprising:

a device for generating a reference clock pulse; and a plurality of signal sensor blocks each allocated to one of the data channels and each connected to said device for receiving the reference clock pulse, each of said signal sensor blocks having a delay-locked loop circuit for compensating for differences in a clock frequency between the reference clock pulse and a respective data channel, said delay-locked loop circuit having an infinite delay range and a bandwidth larger than the difference between the clock frequency of the reference clock pulse and the clock frequency of the respective data channel.

9. The configuration according to claim 8, wherein said device for generating the reference clock pulse includes a phase-locked loop circuit for deriving the reference clock pulse from one of data and a co-supplied clock pulse from one of the data channels serving as a reference channel.

10. The configuration according to claim 8, wherein said device for generating the reference clock pulse includes a clock generator.

11. The configuration according to claim 8, wherein said delay-locked loop circuit has a phase detector, a charge pump connected to the phase detector, and a phase modifier connected to said charge pump.

12. The configuration according to claim 8, wherein each of the data channels are identically constructed and each of said signal sensor blocks are identically constructed.

13. The configuration according to claim 8, including a receiver module to be connected to the data channels.

14. The configuration according to claim 13, wherein said receiver module is a demultiplexer.

15. The configuration according to claim 8, wherein said device for generating the reference clock pulse includes a quartz oscillator.

16. The configuration according to claim 8, including a transmitter module to be connected to the data channels.

17. The configuration according to claim 16, wherein said transmitter module is a multiplexer.

* * * * *